United States Patent
Olson et al.

(10) Patent No.: US 8,815,752 B2
(45) Date of Patent: Aug. 26, 2014

(54) METHODS OF FORMING FEATURES IN SEMICONDUCTOR DEVICE STRUCTURES

(71) Applicant: Micron Technology, Inc., Boise, ID (US)

(72) Inventors: Adam L. Olson, Boise, ID (US); Kaveri Jain, Boise, ID (US); Lijing Gou, Boise, ID (US); William R. Brown, Boise, ID (US); Ho Seop Eom, Boise, ID (US); Xue Chen, Boise, ID (US); Anton J. deVilliers, Clifton Park, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/687,419

(22) Filed: Nov. 28, 2012

(65) Prior Publication Data

US 2014/0145311 A1    May 29, 2014

(51) Int. Cl.
*H01L 21/31* (2006.01)
*H01L 21/469* (2006.01)

(52) U.S. Cl.
USPC .......................... 438/763; 438/948; 257/622

(58) Field of Classification Search
USPC .................. 438/763, 948; 257/622, E21.259, 257/E21.255
See application file for complete search history.

(56) References Cited

U.S. PATENT DOCUMENTS

| | | | |
|---|---|---|---|
| 5,877,076 A | 3/1999 | Dai | |
| 6,291,118 B1 | 9/2001 | Gau et al. | |
| 6,613,485 B2 | 9/2003 | Huang et al. | |
| 6,645,702 B1 | 11/2003 | Rangarajan et al. | |
| 6,753,115 B2 | 6/2004 | Zhang et al. | |
| 6,955,485 B2 | 10/2005 | Ono et al. | |
| 7,033,735 B2 | 4/2006 | Ho | |
| 7,138,654 B2 | 11/2006 | Yu et al. | |
| 7,429,446 B2 | 9/2008 | Sawada et al. | |
| 7,476,612 B2 | 1/2009 | Kim | |
| 7,867,844 B2 | 1/2011 | Hu | |
| 7,884,014 B2 | 2/2011 | Jang | |
| 8,182,982 B2 | 5/2012 | Kobrin | |
| 2003/0165756 A1 | 9/2003 | Ono et al. | |
| 2004/0058550 A1 | 3/2004 | Mono et al. | |
| 2006/0263026 A1* | 11/2006 | Edwards | 385/132 |
| 2007/0105043 A1* | 5/2007 | Elian et al. | 430/270.1 |

(Continued)

OTHER PUBLICATIONS

Shang et al., Verification of Numerical Simulation of the Self-Assembly of Polymer-Polymer-Solvent Ternary Blends on A Heterogeneously Functionalized Substrate, Polymer, vol. 52 (2011) pp. 1447-1457.

*Primary Examiner* — Phuc Dang
(74) *Attorney, Agent, or Firm* — TraskBritt

(57) ABSTRACT

Methods of forming features are disclosed. One method comprises forming a resist over a pool of acidic or basic material on a substrate structure, selectively exposing the resist to an energy source to form exposed resist portions and non-exposed resist portions, and diffusing acid or base of the acidic or basic material from the pool into proximal portions of the resist. Another method comprises forming a plurality of recesses in a substrate structure. The plurality of recesses are filled with a pool material comprising acid or base. A resist is formed over the pool material and the substrate structure and acid or base is diffused into adjacent portions of the resist. The resist is patterned to form openings in the resist. The openings comprise wider portions distal to the substrate structure and narrower portions proximal to the substrate structure. Additional methods and semiconductor device structures including the features are disclosed.

22 Claims, 4 Drawing Sheets

(56) References Cited

U.S. PATENT DOCUMENTS

| | | | |
|---|---|---|---|
| 2008/0179190 A1* | 7/2008 | Hu | 205/125 |
| 2009/0084310 A1 | 4/2009 | Choi et al. | |
| 2009/0214981 A1 | 8/2009 | Halle et al. | |
| 2010/0190346 A1* | 7/2010 | Makiyama et al. | 438/701 |
| 2013/0125988 A1* | 5/2013 | Cao et al. | 136/264 |
| 2013/0309605 A1* | 11/2013 | Jain et al. | 430/270.1 |

\* cited by examiner

METHODS OF FORMING FEATURES IN SEMICONDUCTOR DEVICE STRUCTURES

CROSS-REFERENCE TO RELATED APPLICATION

This application is related to U.S. patent application Ser. No. 13/475,574, filed May 18, 2012, pending, entitled "Methods for Forming Resist Features, Patterns in a Resist, and Arrays of Aligned, Elongate Resist Features."

FIELD

The present disclosure, in various embodiments, relates generally to semiconductor device design and fabrication. More particularly, this disclosure relates to the formation of features having wider distal portions and narrower proximal portions.

BACKGROUND

Contacts and conductive traces are used in semiconductor devices to provide electrical connection. Since contacts and conductive traces are formed by different processing acts, it is necessary to tightly control photolithography and etching processes so that each contact connects with a desired portion of the corresponding conductive trace. For example, a mask used during the photolithography process must be precisely aligned with a substrate on which the contacts and conductive traces are to be formed, and the conditions and duration of the etching process must be accurate. If these processes are not controlled or accurate, the contact may not be formed in the desired location, preventing proper connection with the corresponding conductive trace and causing a short, which may lead to device failure or performance degradation. As device sizes continue to decrease, the margin of error in alignment and etching processes increases, making it even more difficult to accurately align the contacts and the conductive traces. As contacts decrease to sizes less than 40 nm, issues with alignment will become even more problematic.

It would be desirable to form contacts at sizes of less than approximately 40 nm using processes that are more robust and controllable.

DETAILED DESCRIPTION

Figure 1:
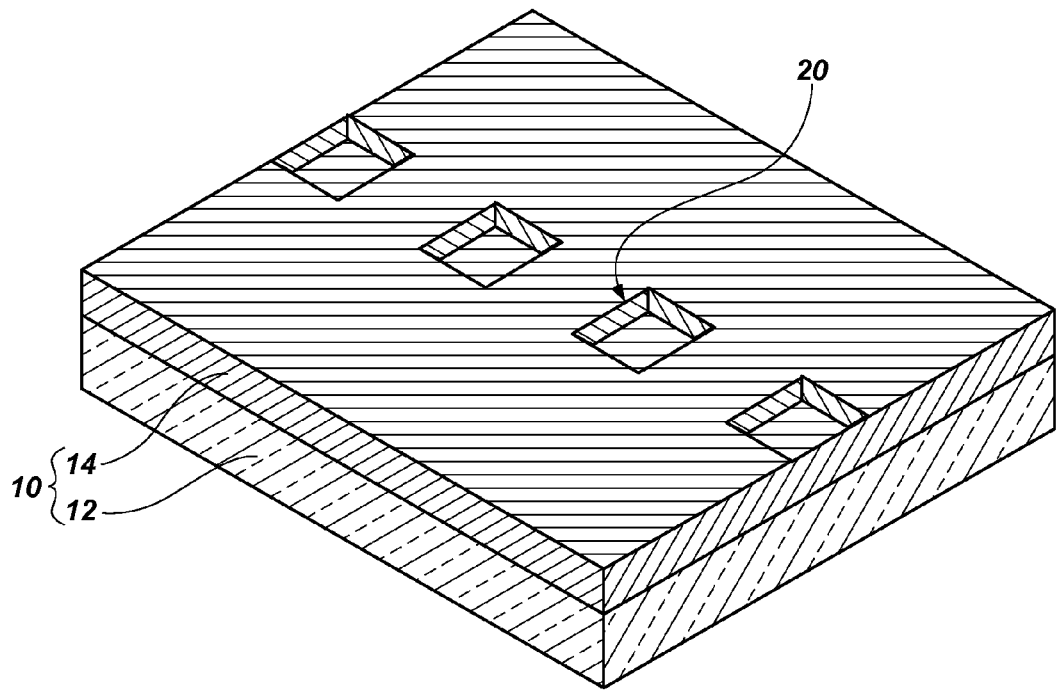
FIGS. 1-3 are isometric schematic illustrations of various stages of forming features according to an embodiment of the present disclosure.

Methods of forming features having a wider distal portion and a narrower proximal portion, and the resulting features are disclosed. As used herein, the terms "distal" and "proximal" refer to a relative distance from a substrate structure on which the feature is formed. The features are formed in openings having a corresponding wider distal portion and a narrower proximal portion. During the formation of the openings, a dimension (e.g., a diameter) of proximal portions of the openings is reduced relative to the dimensions of distal portions of the opening. However, the narrower dimensions of the proximal portions of the openings are not achieved by an etching process. Rather, the narrower dimensions of the proximal portions of the openings are due to their proximity to pools of acidic or basic material. Since the openings have narrower dimensions proximal to the substrate structure, the features formed in the openings also have narrower dimensions at proximal portions of the features. The methods of forming the features are referred to herein as chemical proximity processes since the size of the proximal portions of the features is determined by its proximity to the pools of acidic or basic material.

The pools of acidic or basic material are present in discrete locations below a resist in which the openings and, subsequently, features, such as conductive features, are to be formed. After forming the resist over the pools of acidic or basic material and following exposure to an appropriate energy source, such as an appropriate wavelength of radiation, an acid or a base from the pools may diffuse into portions of the resist proximal to the pools. The diffusion (e.g., catalytic reaction) of the acid or the base alters the acidity of the proximal portions of the resist compared to the initial acidity of the resist and the acidity of distal portions of the resist. Thus, after exposure, portions of the resist may have different relative acidities depending on the proximity of the resist portion to the pools. The resulting acidity of the resist affects the solubility of the portions of the resist in a developer and its subsequent removal in a development process used to form the openings.

Following exposure and development, chemical interactions between acidic portions of the resist and basic portions of the resist may shift an acid-base equilibrium boundary in the resist. Acid or base that diffuses from the pools and into the proximal portions of the resist may increase or decrease the relative acidity in the proximal portions of the resist. Portions of the resist that are more acidic are susceptible to development by a positive tone developer and less likely to be developed by a negative tone developer. Conversely, portions of the resist that are more basic (e.g., less acidic) are less susceptible to development by a positive tone developer and more likely to be developed by a negative tone developer. Portions of the resist may be selectively removed due to their differing solubilities in an appropriately selected positive tone developer or negative tone developer. Due to the presence of the pools, the resulting pattern of openings in the resist may not correspond to a pattern in a mask used during exposure of the resist. Instead, the pattern of openings in the resist includes openings having wider distal portions and narrower proximal portions.

The following description provides specific details, such as material types and processing conditions in order to provide a thorough description of embodiments of the present disclosure. However, a person of ordinary skill in the art would understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. The semiconductor device structures described below do not faun a complete semiconductor device. Only those process acts and structures necessary to understand the embodiments of the present disclosure are described in detail below. Additional acts to form a complete semiconductor device from the semiconductor device structures may be performed by conventional fabrication techniques.

The materials described herein may be formed by any suitable technique including, but not limited to, spin-coating, blanket coating, chemical vapor deposition (CVD), atomic layer deposition (ALD), plasma enhanced ALD, or physical vapor deposition (PVD), unless otherwise specified. Alternatively, the materials may be grown in situ. Depending on the specific material to be formed, the technique for depositing or growing the material may be selected by a person of ordinary skill in the art. While the materials described and illustrated herein may be formed as layers, the materials are not limited thereto and may be formed in other three-dimensional configurations.

The illustrations presented herein are not meant to be actual views of any particular semiconductor structure or semiconductor device, but are merely idealized representations that are employed to describe the present invention. The figures are not necessarily drawn to scale. Additionally, elements common between figures may retain the same numerical designation.

The acidic or basic material of the pools may be an organic material, such as a polymer or a photoresist. The acidic or basic material may be formulated to be coated, such as spin-coated, on the substrate structure to form the pools of acidic or basic material. The acidic or basic material may be formulated to include an acid or a base, or may be formulated to generate the acid or the base upon exposure to an appropriate energy source, such as radiation or heat. The former category of materials is referred to herein as acidic materials or basic materials, while the latter category of materials is referred to herein as acid-generating or base-generating material. The acidic material or acid-generating material may have, at least at some stage during processing, a pH below about 7. The basic material or base-generating material may have, at least at some stage during processing, a pH above about 7. For convenience, the term "acidic pool material" is used herein to refer to the acidic material and/or the acid-generating material. For convenience, the term "basic pool material" is used herein to refer to the basic material and/or the base-generating material. For convenience, the term "pool material" is used herein to refer to the acidic pool material and/or the basic pool material.

The pool material may be a conventional 248 nm resist or 193 nm resist, such as a methacrylate-based or cyclic olefin-based photoresist. The pool material may also be a chemically amplified resist. The pool material may alternatively or additionally include an oxide, a bottom anti-reflective coating (BARC) material, a top anti-reflective coating (TARC) material, or other such material that contains acid or base or that is formulated to generate acid or base. The acidic pool material may alternatively or additionally include at least one of a photo acid generator (PAG) and a thermal acid generator (TAG). In some embodiments, the acidic pool material is a resist including between about 0.01 weight percent and about 10 weight percent PAG. Upon heating or photo-exposing, acid may be generated in the acidic pool material by activating the PAG. Similarly, the basic pool material may alternatively or additionally include a thermal base generator (TBG). In some embodiments, the basic pool material is a resist including between about 0.01 weight percent and about 10 weight percent TBG. Upon heating or photo-exposing, base may be generated in the basic pool material by activating the TBG.

The resist may be a photoresist material formulated such that the material may be applied or otherwise formed and developed to remove only select portions thereof so as to define the openings. The resist may be a positive tone resist or a negative tone resist. The resist, upon initial formation, may be a basic resist or an acidic resist. For example, and without limitation, the resist may be a conventional 248 nm resist or 193 nm resist, such as a methacrylate-based or cyclic olefin-based photoresist. The resist may be formulated to be coated, such as spin-coated, over the pools and substrate structure.

The features may be formed in openings having a wider distal portion and a narrower proximal portion as illustrated in FIGS. 1-8. In FIG. 1, a plurality of recesses 20 are formed in a substrate structure 10. While FIG. 1 shows four recesses 20, the number of recesses 20 may be altered depending on the desired number of features to be formed. The substrate structure 10 may include a substrate 12 and at least one other material, such as a hardmask 14, supported by the substrate 12. As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, or other semiconductor or opto-electronic materials, such as silicon-germanium, germanium, gallium arsenide, gallium nitride, and indium phosphide. The substrate may be doped or undoped. Furthermore, when reference is made to a "substrate" in the following description, previous process stages may have been utilized to form materials, regions, or junctions in or on the base semiconductor structure or foundation. In some embodiments, the substrate 12 is a semiconductor substrate.

The hardmask 14 may be at least one of a silicon- or a metal-containing material, a BARC, a TARC, an acid-rinsed material, and a topcoat material. The recesses 20 may be formed at locations between which the openings are to be formed. The recesses 20 may be periodic and formed at the same pitch as the contacts that are ultimately to be formed in the openings. The recesses 20 may be formed in the hardmask 14 of the substrate structure 10. The recesses 20 may be shallow, e.g., extend partially into the thickness of the hardmask 14. The recess 20 may have a low aspect ratio (e.g., a ratio of the height of the recess 20 to the width of the recess 20 that is less than 1:1, e.g., 1:2 or 1:4). The height of the recesses 20 may range from approximately 1 nm to approximately 250 nm, such as approximately 5 nm. The length of the recesses 20 may range from approximately 1 μm to the length of the array. The width of the recesses 20 may range from approximately 1 nm to approximately 40 nm, such as approximately 20 nm. The recesses 20 may be formed by conventional methods, which are not described in detail herein.

Figure 2:
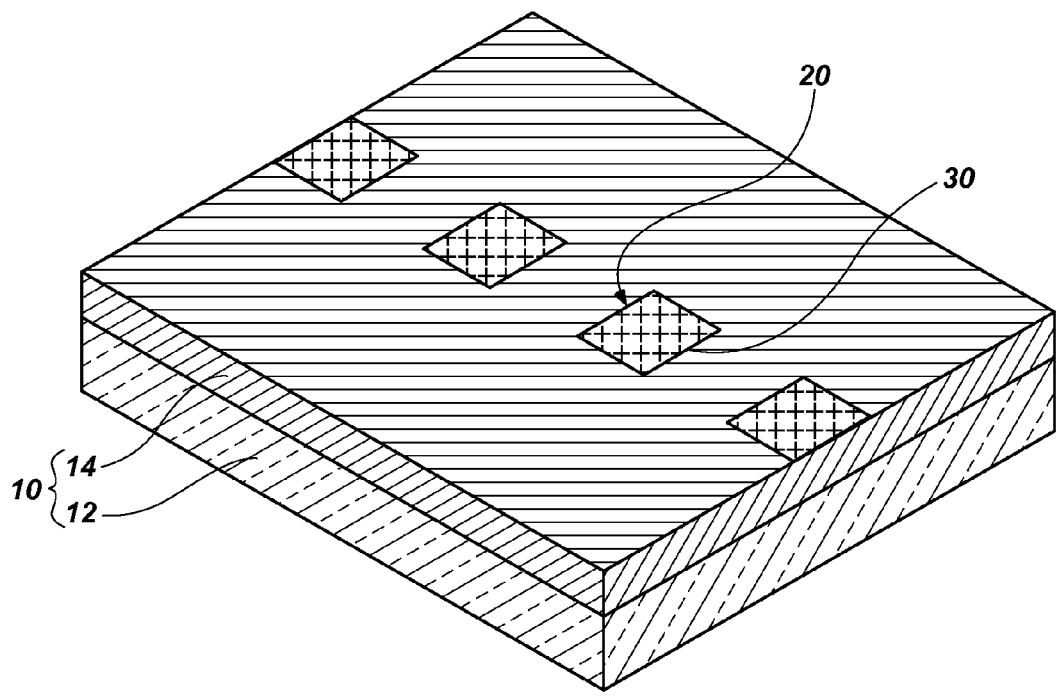

Pools 30 of acidic or basic material may be formed in the recesses 20, as shown in FIG. 2, by conventional methods, which are not described in detail herein. The locations of the pools 30 may be determined by first determining where the features are to be formed. The pools 30 may then be formed to be periodic and at the same pitch as the features that are ultimately to be formed in the openings. The pools 30 may be supported by the substrate structure 10. The pools 30 of acidic or basic material may include one of the materials previously described, such as the acidic pool material or the basic pool material. Selection of the material to be used as the pool material may depend on the material to be used as the resist and the development process to be used. To form the pools 30, for example and without limitation, the pool material may be dissolved in an organic solvent, and the solution of the pool material may be formed in the recesses 20. By way of example, the solution of the pool material may be spin-coated on the substrate structure 10. The pool material may be exposed to heat (e.g., baked) to convert the pool material to a material immiscible in the organic solvent. The pools 30 and the hardmask 14 may be planarized by an appropriate conventional method (e.g., chemical-mechanical planarization (CMP), a develop back process) so that an upper surface of the pools 30 is co-planar with a surface of the hardmask 14. The pools 30 may, alternatively, be subjected to a dry etch process to remove portions of the pool material.

Figure 3:
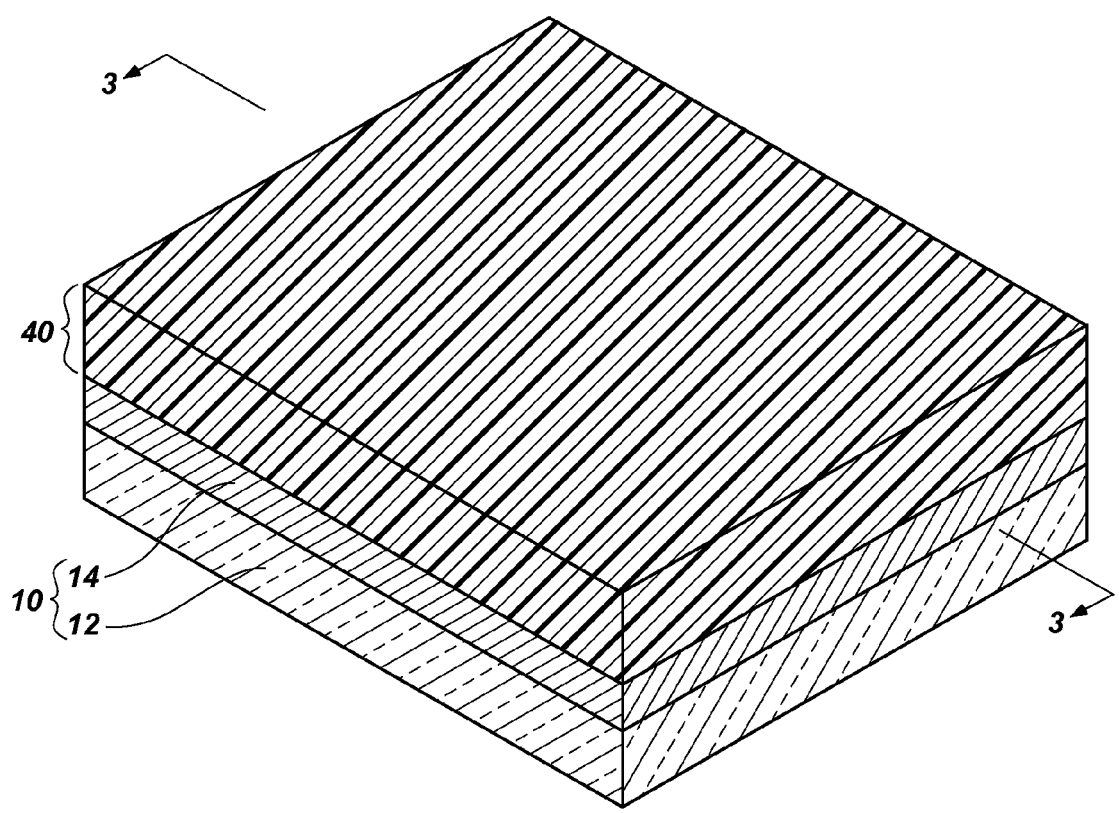
Figure 4:
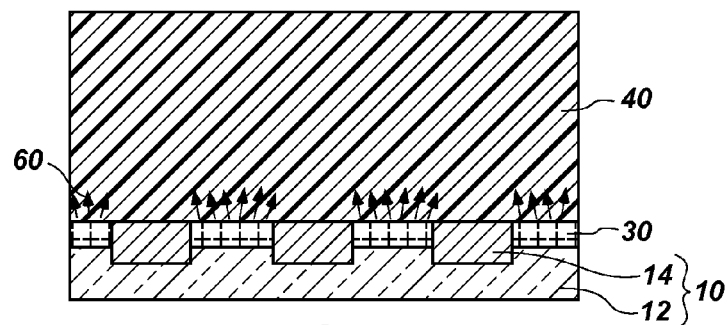
FIG. 4 is a cross-sectional illustration taken along section line 3-3 of FIG. 3.

As shown in FIGS. 3 and 4, resist 40 may be formed over the substrate structure 10 and the pools 30. The resist 40 may be formed after the pools 30 are made acidic or basic, or before the pools 30 are made acidic or basic. If, for example, the resist 40 is formed over the pools 30 before the pools 30 are made acidic or basic, the pools 30 may be heated (e.g., baked) after forming the resist 40 to generate the acid or the base.

Forming the resist 40 over the pools 30 may be accomplished using an appropriate conventional formation method, such as spin-coating of the material of the resist 40. In some embodiments, both the pool material and the resist 40 are resist materials. Therefore, each of the pools 30 and the resist 40 may be formed using a solution of the pool material and a solution of the resist 40, respectively. The organic solvent of the pool material and the resist 40 may be selected depending on the miscibility and immiscibility of each other. For example, the organic solvent may be an alcohol, cyclohexanone, propylene glycol methyl ether acetate (PGMEA), propylene glycol monomethyl ether (PGME), or combinations thereof. Since the resist 40 may be formed over the pools 30, the organic solvent in which the resist 40 is dissolved may be immiscible with the pool material. Accordingly, forming the resist 40 over the pools 30 may not affect the pools 30. Once formed, the pool material may be exposed to the energy source to convert the pool material to a material immiscible in the organic solvent, forming the pools 30. The resist 40, which may be the same resist material used as the pool material, may be formed over the pools 30 using the same organic solvent. The pools 30, now being immiscible in the organic solvent, may not be affected by the formation of the resist 40 using the solution of the resist 40 in the organic solvent.

Figure 5A:
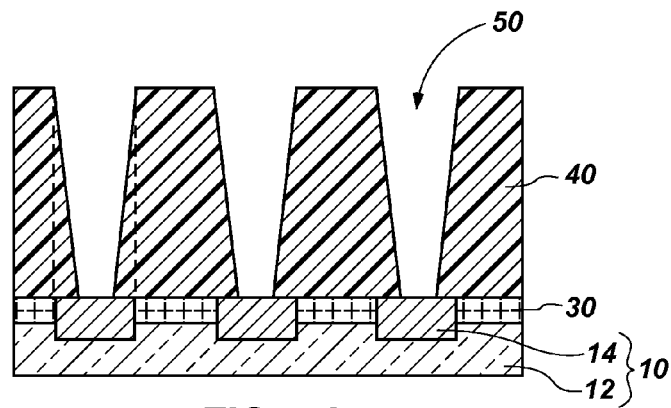
FIGS. 5A-6B are cross-sectional illustrations of subsequent stages of forming features according to an embodiment of the present disclosure.

As shown in FIG. 5A, the resist 40 may be patterned to form openings 50. By selectively exposing the resist 40 to an appropriate energy source, e.g., light or radiation, or to a chemical composition, the miscibility of exposed portions of the resist 40 in a developer may be altered relative to the miscibility of non-exposed portions of the resist 40. As known in the art, a mask (not shown) may be used to selectively expose the resist 40, fainting exposed resist portions and non-exposed resist portions. The mask includes a pattern that at least partially conforms to a pattern of openings 50 ultimately to be formed in the resist 40. During exposure, the acid or the base from the pools 30 may diffuse into the resist 40 in the directions illustrated by arrows 60 in FIG. 4. By way of example, the acid or the base may diffuse into portions of the resist 40 proximal to the pools 30. The diffusion of the acid or the base from the pools 30 may alter the acidity of the resist 40, thus altering the miscibility of the resist 40 in the developer to be used during development.

During development, portions of the resist 40 may be removed to form openings 50 in the resist 40. Depending on the materials used as the pool 30 and the resist 40, a positive tone development process or a negative tone development process may be used to remove the exposed or non-exposed resist portions. The desired portions of resist 40 may be removed by appropriately selecting the developer in which the desired portions of resist 40 are miscible. Due to the respective acid or base diffusion, the resist 40 adjacent to (e.g., proximal to) the pools 30 may not be removed during development while the resist 40 distal to the substrate structure 10 and the pools 30 may be removed. Since portions of the resist 40 around the pools 30 remain, the proximal portions of the openings 50 in the resist 40 may have a narrower dimension than the distal portions.

Figure 5B:
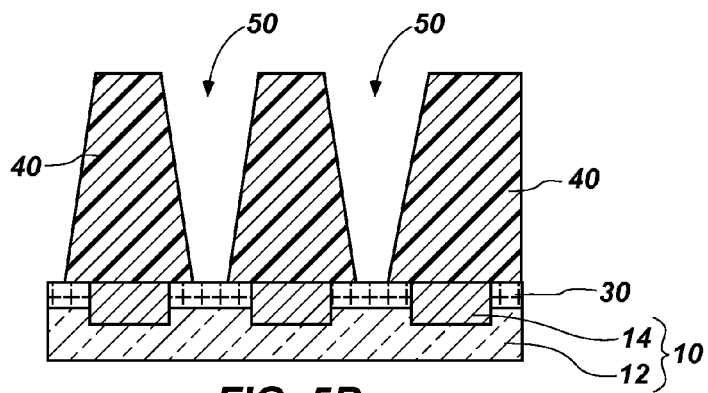

The openings 50 shown in FIG. 5A may be formed by appropriately selecting the pool material, resist, positioning the mask, and using a positive tone developer or negative tone developer, as appropriate. By way of example, if basic material is used to form the pools 30 and the mask is positioned to expose overlying portions of the resist 40 positioned between the pools 30, a positive tone developer may be used to form the openings 50. Base from each of the pools 30 may diffuse into adjacent portions of the resist 40, decreasing the acidity of the adjacent portions of the resist 40 relative to the other portions of resist 40. The base may neutralize acid in the adjacent portions of the resist 40, decreasing the acid concentration in the adjacent portions of the resist 40. When the resist 40 is subjected to the positive tone developer, the more acidic portions of the resist 40 are soluble in the positive tone developer and are, thus, removed, forming the openings 50. Conversely, by selecting a different combination of pool material, resist, and positive tone developer or negative tone developer, the openings 50 may be formed as shown in FIG. 5B. In FIG. 5B, the openings 50 are positioned directly over the pools 30, while in FIG. 5A the openings 50 are positioned between adjacent pools 30 (e.g., directly over exposed portions of the hardmask 14).

Alternatively, if the mask is positioned to prevent exposure of portions of the resist 40 directly overlying the pools 30 and basic material is used to form the pools 30, a negative tone developer may be used to form the openings 50. Base from the pools 30 may diffuse into adjacent portions of the resist 40, decreasing the acidity of the adjacent portions of the resist 40 relative to the other portions of resist 40. When the resist 40 is subjected to an appropriately selected negative tone developer, the more basic portions of the resist 40 are soluble in the negative tone developer and are, thus, removed, forming the openings 50.

If acidic material is used to form the pools 30 and the mask is positioned to prevent exposure of overlying portions of the resist 40 positioned between the pools 30, a negative tone developer may be used to form the openings 50. Acid from the pools 30 may diffuse into adjacent portions of the resist 40, increasing the acidity of the adjacent portions of the resist 40 relative to the other portions of resist 40. The acid may increase the acid concentration in the adjacent portions of the resist 40. When the resist 40 is subjected to the negative tone developer, the less acidic portions of the resist 40 are soluble in the negative tone developer and are, thus, removed, forming the openings 50.

Alternatively, if the mask is positioned to expose portions of the resist 40 directly overlying the pools 30 and acidic material is used to form the pools 30, a positive tone developer may be used to form the openings 50. Acid from the pools 30 may diffuse into adjacent portions of the resist 40, increasing the acidity of the adjacent portions of the resist 40 relative to the other portions of resist 40. When the resist 40 is subjected to the positive tone developer, the less acidic portions of the resist 40 are soluble in the positive tone developer and are, thus, removed, forming the openings 50.

Embodiments of the method of the present disclosure may also be used to transfer the pattern (see FIGS. 5A and 5B) in the resist 40 to the substrate structure 10. The pattern in the resist 40 may be transferred to the hardmask 14 and substrate 12 by an etch process. Thus, features (not shown) in the substrate structure 10 may be formed that correspond to the pattern in the resist 40. The features (not shown) in the substrate structure 10 may be formed at a smaller size than is possible using conventional processes, such as at less than approximately 40 nm The dimensions (e.g., width, length) of the openings 50 in the proximal portion of the resist 40 may depend on the proximity to the pools 30, the materials used as the pool material and resist 40, and processing conditions used to form the openings 50. By appropriately selecting the concentration of the acid or the base in the pools 30, the size and location of the pools 30, exposure conditions including the time and temperature of the exposure, and development conditions, the dimensions of the proximal portions of the openings 50 may be tailored as desired. For example, if the pools 30 are formulated to include a large concentration of the acid or the base, the dimensions of the proximal portions of the openings 50 may be narrower than if the pools 30 included a smaller concentration of the acid or the base. Similarly, if the pools 30 are in close proximity to the openings 50 to be formed, the dimensions of the proximal portions of the openings 50 may be narrower than if the pools 30 were positioned a greater distance away. If large pools 30 are in close proximity to the openings 50 to be formed, the dimensions of the proximal portions of the openings 50 may be narrower than if the pools 30 were smaller. By increasing at least one of the amount of time and the temperature of exposure, the dimensions of the proximal portions of the openings 50 may be narrower than if a shorter amount of time and/or lower temperature are used.

As shown in FIGS. 5A and 5B, sidewalls of the resist 40 defining the openings 50 may be sloped (e.g., non-vertical). In contrast, if the pools 30 were not present below the resist 40, the sidewalls of the openings 50 would be substantially vertical, as shown in dashed lines on the left side of FIG. 5A, and the proximal portions and the distal portions of the openings 50 would have substantially the same diameter. While FIGS. 5A and 5B show the sidewalls of the resist 40 as having a uniform taper, the sidewalls may have a different profile (e.g., a non-uniform slope) depending on the proximity of the resist 40 to the pools 30, the size of the pools 30, and the concentration of the acid or the base in the pools 30.

Figure 6A:
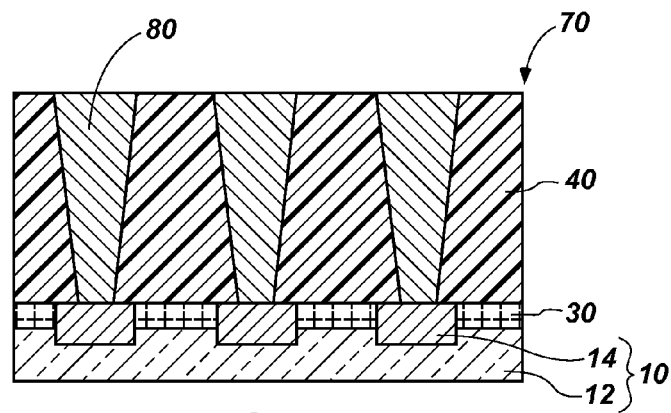
Figure 6B:
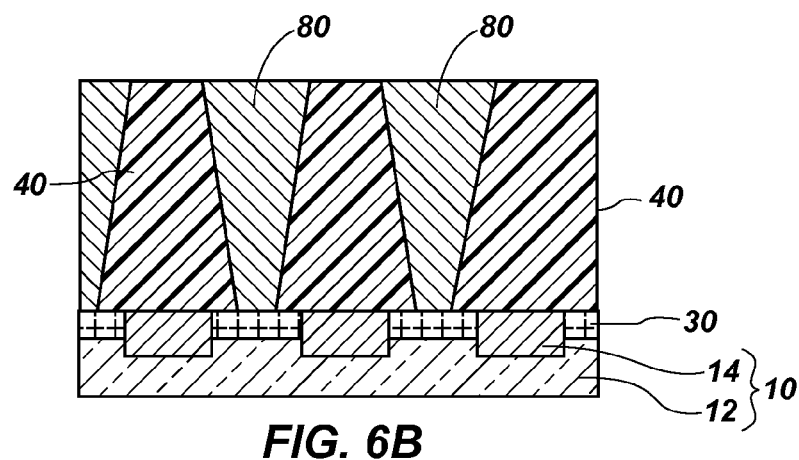
Figure 7:
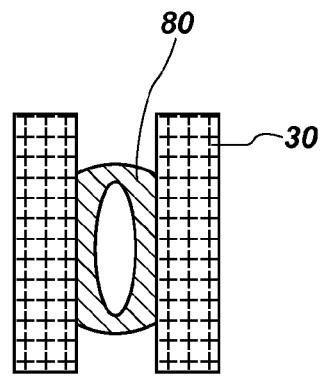
FIG. 7 is a top down view of a feature according to an embodiment of the present disclosure.

As shown in FIG. 6A, the openings 50 (see FIG. 5A) may be filled with a fill material, such as a conductive material, to form a semiconductor device structure 70 having features 80. The fill material may be formed in the openings 50 by conventional techniques, which are not described in detail herein. The fill material may be a metal (e.g., tungsten, nickel, tantalum nitride (TaN), platinum, tungsten nitride (WN), gold, titanium nitride (TiN), or titanium aluminum nitride (TiAlN)), polysilicon, other conductive materials, or combinations thereof. The fill material may also be an oxide. The resist 40 may subsequently be removed, such as by conventional techniques, with the features 80 remaining on the substrate structure 10. The features 80 may be positioned between adjacent pools 30. As shown in FIG. 7, which is a top down view of a feature 80 of FIG. 6A after the resist 40 has been removed, the feature 80 may have a tapered profile, with a proximal portion of the feature 80 having a narrower diameter than the distal portion. The features 80 may overlay remaining portions of the hardmask 14 and be positioned between adjacent pools 30. The pools 30 may, optionally, be removed during subsequent processing acts to form memory devices including the features 80. Alternatively, the openings 50 of FIG. 5B may be filled with the fill material to form a semiconductor device structure 70 having the features 80 positioned directly over the pools 30, as shown in FIG. 6B.

Disclosed is a method of forming a feature comprising forming a resist over a pool of acidic or basic material on a substrate structure. The resist is selectively exposed to an energy source to form exposed resist portions and non-exposed resist portions. Acid or base of the acidic or basic material is diffused from the pool into proximal portions of the resist.

Also disclosed is a method of forming a feature comprising forming a plurality of recesses in a substrate structure. The plurality of recesses are filled with a pool material comprising acid or base. A resist is formed over the pool material and the substrate structure and the acid or the base is diffused into adjacent portions of the resist. The resist is patterned to form openings in the resist. The openings comprise wider portions distal to the substrate structure and narrower portions proximal to the substrate structure.

Another method of forming a feature is disclosed. The method comprises forming a plurality of recesses in a substrate structure. The plurality of recesses are filled with a pool material comprising acid or base and a resist is formed over the pool material and the substrate structure. The resist is selectively exposed to an energy source to form exposed resist portions and non-exposed resist portions. The acid or the base is diffused from the pool material into adjacent portions of the resist to alter a solubility of the resist in a developer used to remove portions of the resist. Openings are formed in the resist, the openings comprising wider portions distal to the substrate structure and narrower portions proximal to the substrate structure.

A semiconductor device structure is also disclosed. The semiconductor device structure comprises a plurality of feature on a substrate structure, each of the plurality of features comprising wider distal portions and narrower proximal portions. The narrower proximal portions are adjacent a pool material comprising an acid or a base.

By utilizing the chemical proximity process to form the openings 50, the features 80 may be formed at small sizes, such as at less than approximately 40 nm. In some embodiments, the features 80 are contacts having diameters of less than approximately 40 nm. By producing the openings 50 having sloping sidewalls, the proximal portions of the openings 50 may be narrower than the distal portions, enabling the features 80 formed in the openings 50 to self-align and contact underlying conductive traces (not shown). By using the pools 30 to mark locations between which the openings 50 in the resist 40 are to be formed, the features 80 may be self-aligned and contact underlying the conductive traces. Accordingly, the features 80 may be formed with narrower dimensions at the portions proximal to the substrate structure 10 without using an etch process.

The chemical proximity process may also be used to form openings 50 overlying the pools 30, as shown in FIG. 5B. In contrast to FIG. 5A, in which the openings 50 are formed between pools 30, the pools 30 in FIG. 5B may mark locations above which the openings 50 are to be formed. The openings 50 (see FIG. 5B) may be filled with the fill material to form a semiconductor device structure 70 having the features 80 positioned directly over the pools 30, as shown in FIG. 6B.

The chemical proximity process may also be used to form features (not shown) in the substrate structure 10 by transferring the pattern in the resist 40 to the substrate structure 10. For instance, the pattern in the resist 40 (see FIGS. 5A and 5B) may be transferred to the substrate structure 10 by a conventional etch process. By utilizing the pattern in the resist 40 as a mask, the resulting features (not shown) in the substrate structure 10 may be formed at smaller sizes than is possible using conventional processes due to the size of the openings 50.

Figure 8:
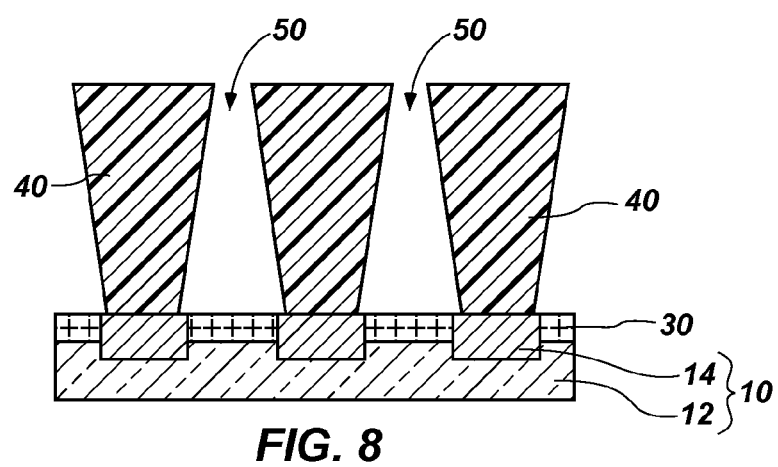
FIG. 8 is a cross-sectional illustration of a subsequent stage of forming features according to an embodiment of the present disclosure.

The chemical proximity process may also be used to form openings 50 having narrower distal portions and wider proximal portions, as shown in FIG. 8. By appropriately selecting the pool material, resist, positioning the mask, and using a positive tone developer or negative tone developer, the openings 50 of FIG. 8 may be formed substantially as described above in reference to FIGS. 1-5B. Thus, the chemical proximity process may be used to form openings 50 having narrowed portions (FIGS. 5A and 5B) proximal to the substrate structure 10 in addition to openings 50 having widened portions (FIG. 8) proximal to the substrate structure 10. The openings 50 of FIG. 8 may be filled with a fill material as described above. Alternatively, the pattern in the resist 40 of FIG. 8 may be transferred to the substrate structure 10 as described above.

By utilizing an embodiment of the chemical proximity process, the openings 50 or the resist 40 may be self-aligned with the underlying pools 30. By appropriately selecting the pool material, resist, positioning the mask, and using a positive tone developer or negative tone developer, the acid or the base from the pools 30 may diffuse into the resist 40 during development. Depending on the amount of acid or base present in the pools 30, the acid or base may diffuse into portions of the resist 40 adjacent to the pools 30. The diffusion of the acid or the base from the pools 30 may alter the acidity of the resist 40, thus altering the miscibility of the resist 40 in the developer to be used during development. Following the development, sidewalls of the openings 50 or the resist 40 may be self-aligned with edges of the pools 30.

The methods described above may be used to form features 80, such as contacts, for memory devices, such as, by way of non-limiting example, flash memory or dynamic random-access memory (DRAM) devices. However, the methods may also be used in other situations in which features having wider distal portions and narrower proximal portions are to be formed. The memory device may be used in wireless devices, personal computers, or other electronic devices.

While the present disclosure is susceptible to various modifications and alternative forms, specific embodiments have been shown by way of example in the drawings and have been described in detail herein. However, the present disclosure is not intended to be limited to the particular forms disclosed. Rather, the present disclosure is to cover all modifications, equivalents, and alternatives falling within the scope of the present disclosure as defined by the following appended claims and their legal equivalents.

What is claimed is:

1. A method of forming a feature, comprising:
    forming a resist over a pool of an acidic material or a basic material on a substrate structure;
    selectively exposing the resist to an energy source to form exposed resist portions and non-exposed resist portions;
    diffusing acid of the acidic material or base of the basic material from the pool into proximal portions of the resist; and
    exposing the resist to a developer to remove a greater amount of distal portions of the resist relative to the proximal portions of the resist to form openings in the resist, wherein the openings comprise sloping sidewalls.

2. The method of claim 1, wherein forming a resist over a pool of an acidic material or a basic material comprises forming a resist over a pool of an acidic material or a basic material selected from the group consisting of a polymer, a photoresist, an oxide, a bottom anti-reflective coating, and a top anti-reflective coating.

3. The method of claim 2, wherein forming a resist over a pool of an acidic material or a basic material comprises forming a resist over a pool of an acidic material or a basic material comprising a 248 nm resist or a 193 nm resist comprising the acid or the base.

4. The method of claim 1, wherein diffusing acid of the acidic material or base of the basic material from the pool into proximal portions of the resist comprises altering an acidity of the proximal portions of the resist.

5. The method of claim 1, wherein exposing the resist to a developer comprises removing the exposed resist portions except the proximal portions of the exposed resist portions to form the openings in the resist.

6. The method of claim 1, wherein exposing the resist to a developer comprises removing the non-exposed resist portions except the proximal portions of the non-exposed resist portions to form the openings in the resist.

7. The method of claim 1, further comprising filling the at least one opening with a conductive material.

8. A method of forming a feature, comprising:
    forming a plurality of recesses in a substrate structure;
    filling the plurality of recesses with a pool material comprising acid or base;
    forming a resist over the pool material and the substrate structure;
    diffusing the acid or the base into portions of the resist proximal to the substrate structure more than into portions of the resist distal to the substrate structure; and
    removing a greater amount of the portions of the resist distal to the substrate structure than the amount of the portions of the resist proximal to the substrate structure to form openings in the resist, the openings comprising wider portions distal to the substrate structure and narrower portions proximal to the substrate structure.

9. The method of claim 8, wherein forming a plurality of recesses in a substrate structure comprises forming the plurality of recesses partially extending into the substrate structure.

10. The method of claim 8, wherein forming a plurality of recesses in a substrate structure comprises forming the plurality of recesses at a depth of from approximately 1 nm to approximately 10 nm.

11. The method of claim 8, wherein filling the plurality of recesses with a pool material comprises forming the pool material over the plurality of recesses and the substrate structure and removing a portion of the pool material overlying the substrate structure.

12. The method of claim 8, wherein diffusing the acid or the base into portions of the resist proximal to the substrate structure more than into portions of the resist distal to the substrate structure comprises:
    exposing the resist to an energy source to form exposed resist portions and non-exposed resist portions;
    diffusing the acid or the base from the pool material into the proximal portions of the resist; and
    removing at least a portion of the exposed resist portions without removing the non-exposed resist portions and the proximal portions of the resist containing the acid or the base.

13. The method of claim 8, wherein diffusing the acid or the base into portions of the resist proximal to the substrate structure more than into portions of the resist distal to the substrate structure comprises:
- exposing the resist to an energy source to form exposed resist portions and non-exposed resist portions;
- diffusing the acid or the base from the pool material into the proximal portions of the resist; and
- removing at least a portion of the non-exposed resist portions without removing the exposed resist portions and the proximal portions of the resist containing the acid or the base.

14. The method of claim 8, further comprising filling the openings with a conductive material to form conductive features comprising wider portions distal to the substrate structure and narrower portions proximal to the substrate structure.

15. The method of claim 14, wherein filling the openings with a conductive material to form conductive features comprises forming the conductive features comprising wider portions distal to the substrate structure and narrower portions proximal to the substrate structure, the narrower proximal portions comprising a length of from approximately 5 nm to approximately 40 nm and a width of from approximately 5 nm to approximately 40 nm.

16. The method of claim 14, wherein filling the openings with a conductive material to form conductive features comprises forming a plurality of contacts.

17. A method of forming a feature, comprising:
- forming a plurality of recesses in a substrate structure;
- filling the plurality of recesses with a pool material comprising acid or base;
- forming a resist over the pool material and the substrate structure;
- selectively exposing portions of the resist to an energy source to form exposed resist portions and non-exposed resist portions;
- diffusing the acid or the base from the pool material into adjacent portions of the resist to alter a solubility of the resist in a developer used to remove portions of the resist; and
- exposing the resist to the developer to selectively remove distal portions of the resist relative to the adjacent portions of the resist to form openings in the resist, the openings comprising wider portions distal to the substrate structure and narrower portions adjacent to the substrate structure.

18. The method of claim 17, wherein forming openings in the resist comprises forming the openings comprising wider portions distal to the substrate structure and narrower portions adjacent to the substrate structure without utilizing an etching process to form the narrower portions adjacent to the substrate structure.

19. The method of claim 17, wherein forming openings in the resist comprises removing at least a portion of the exposed resist portions with a positive tone developer without removing the non-exposed resist portions and the adjacent portions of the resist comprising the diffused acid or the diffused base.

20. The method of claim 17, wherein forming openings in the resist comprises removing at least a portion of the non-exposed resist portions with a positive tone developer without removing the exposed resist portions and the adjacent portions of the resist comprising the diffused acid or the diffused base.

21. The method of claim 17, wherein forming openings in the resist comprises removing at least a portion of the exposed resist portions with a negative tone developer without removing the non-exposed resist portions and the adjacent portions of the resist comprising the diffused acid or the diffused base.

22. The method of claim 17, wherein forming openings in the resist comprises removing at least a portion of the non-exposed resist portions with a negative tone developer without removing the exposed resist portions and the adjacent portions of the resist comprising the diffused acid or the diffused base.

* * * * *